United States Patent
Han et al.

(10) Patent No.: US 11,374,133 B2
(45) Date of Patent: Jun. 28, 2022

(54) METAL MATRIX COMPOSITES FOR CONTACTS ON SOLAR CELLS

(71) Applicant: UNM RAINFOREST INNOVATIONS, Albuquerque, NM (US)

(72) Inventors: Sang M. Han, Albuquerque, NM (US); Omar Abudayyeh, Albuquerque, NM (US); David Wilt, Albuquerque, NM (US); Nathan Gapp, Albuquerque, NM (US)

(73) Assignee: UNM RAINFOREST INNOVATIONS, Albuquerque, NM (US)

( * ) Notice: Subject to any disclaimer, the term of this patent is extended or adjusted under 35 U.S.C. 154(b) by 160 days.

(21) Appl. No.: 15/737,250

(22) PCT Filed: Jun. 17, 2016

(86) PCT No.: PCT/US2016/038197
§ 371 (c)(1),
(2) Date: Dec. 15, 2017

(87) PCT Pub. No.: WO2016/205722
PCT Pub. Date: Dec. 22, 2016

(65) Prior Publication Data
US 2018/0175218 A1 Jun. 21, 2018

Related U.S. Application Data

(60) Provisional application No. 62/180,960, filed on Jun. 17, 2015.

(51) Int. Cl.
*H01L 31/00* (2006.01)
*H01L 31/02* (2006.01)
(Continued)

(52) U.S. Cl.
CPC ........ *H01L 31/02008* (2013.01); *B82Y 40/00* (2013.01); *H01L 31/05* (2013.01);
(Continued)

(58) Field of Classification Search
CPC ............... H01L 31/02008; H01L 31/05; H01L 31/022425; H01L 31/022491;
(Continued)

(56) References Cited

U.S. PATENT DOCUMENTS 3,909,929 A * 10/1975 Debesis ................. H01L 33/22
438/26
2001/0015321 A1* 8/2001 Reid ........................ C25D 3/38
205/103
(Continued)

FOREIGN PATENT DOCUMENTS

CN 202855787 U 4/2013

OTHER PUBLICATIONS

Prevo et al., Controlled, rapid deposition of structured coatings from micro- and nanoparticle suspension, 2004, Langmuir, 20, 2099-2107 (Year: 2004).*
(Continued)

*Primary Examiner* — Angelo Trivisonno
(74) *Attorney, Agent, or Firm* — MH2 Technology Law Group LLP

(57) ABSTRACT

A method for forming electrical contacts for a solar cell and a solar cell formed using the method is provided. The method includes forming a first metal layer over predefined portions of a surface of the solar cell; depositing a carbon nanotube layer over the first metal layer; and forming a second metal layer over the carbon nanotube layer, wherein the first metal layer, the carbon nanotube layer, and the (Continued)

second metal layer form a first metal matrix composite layer that provides electrical conductivity and mechanical support for the metal contacts.

19 Claims, 19 Drawing Sheets

(51) Int. Cl.
*B82Y 40/00* (2011.01)
*H01L 31/05* (2014.01)
*H02S 40/44* (2014.01)
*B82Y 30/00* (2011.01)

(52) U.S. Cl.
CPC ............... *H02S 40/44* (2014.12); *B82Y 30/00* (2013.01); *Y10S 977/75* (2013.01); *Y10S 977/752* (2013.01); *Y10S 977/842* (2013.01); *Y10S 977/89* (2013.01); *Y10S 977/891* (2013.01); *Y10S 977/901* (2013.01); *Y10S 977/948* (2013.01)

(58) Field of Classification Search
CPC ..... B82Y 30/00; Y10S 977/948; Y02E 10/50; H05K 3/4688; H05K 3/249; H05K 2201/032; H05K 2201/0323; H05K 2201/0335; H05K 2201/0338
See application file for complete search history.

(56) References Cited

U.S. PATENT DOCUMENTS

| | | | |
|---|---|---|---|
| 2004/0197638 A1* | 10/2004 | McElrath | B01J 21/185 429/454 |
| 2006/0115640 A1* | 6/2006 | Yodh | B82Y 10/00 428/221 |
| 2008/0131658 A1* | 6/2008 | Wakharkar | B82Y 10/00 428/137 |
| 2009/0020829 A1* | 1/2009 | Chandra | H01L 21/28518 257/384 |
| 2009/0034156 A1* | 2/2009 | Yamamoto | H01G 4/33 361/311 |
| 2009/0206979 A1* | 8/2009 | Tepper | H01C 10/16 338/115 |
| 2009/0260688 A1* | 10/2009 | Sun | H01L 31/022466 136/261 |
| 2009/0266580 A1* | 10/2009 | Jung | B82Y 30/00 174/126.2 |
| 2011/0237000 A1* | 9/2011 | Tey | B82Y 15/00 436/518 |
| 2012/0156824 A1* | 6/2012 | Streett | H01L 31/049 438/66 |
| 2013/0048339 A1* | 2/2013 | Tour | H01L 31/022491 174/126.1 |
| 2013/0087463 A1* | 4/2013 | Schroiff | C25D 7/12 205/82 |
| 2013/0153011 A1* | 6/2013 | Jin | B82Y 10/00 136/255 |
| 2014/0030843 A1 | 1/2014 | Ahmed et al. | |
| 2014/0151111 A1* | 6/2014 | Shah | H05K 9/009 174/388 |
| 2014/0224312 A1* | 8/2014 | Brown | H01L 31/022425 136/256 |

OTHER PUBLICATIONS

Listvina, (Authorized PCT Officer), "PCT Notification of Transmittal of the International Search Report and the Written Opinion of the International Searching Authority, or the Declaration," dated Oct. 20, 2016.

* cited by examiner

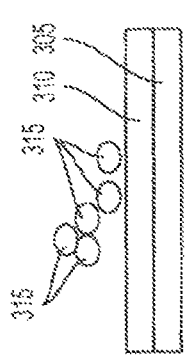
FIG. 3A
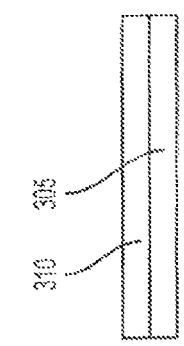
FIG. 3B
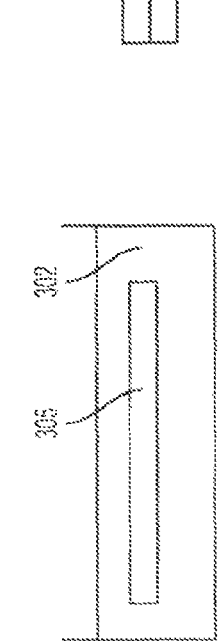
FIG. 3C
FIG. 3D
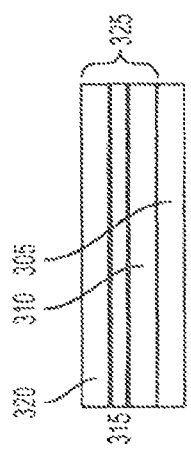
FIG. 3E
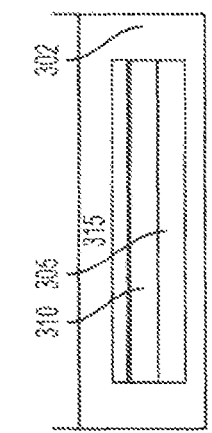
FIG. 3F
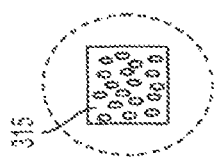
FIG. 3G
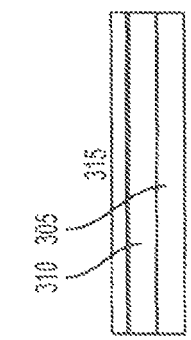

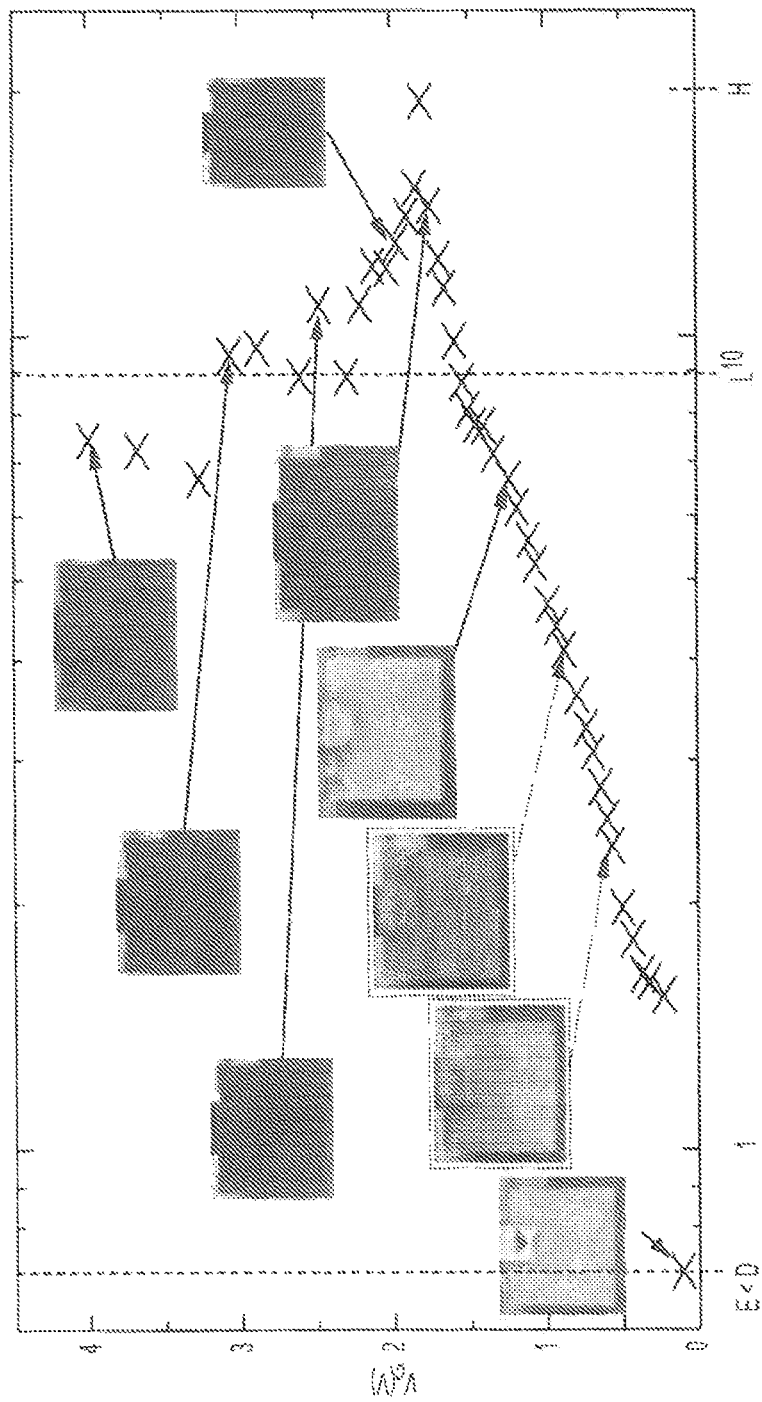
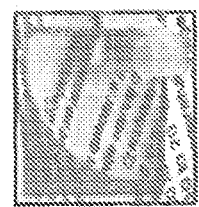
FIG. 5A
FIG. 5B

| SAMPLE | %Δ $J_{SC}$ | %Δ $V_{OC}$ | %Δ FF | %Δ η |
|---|---|---|---|---|
| Ctrl (Std.) | 15.0 | 0.1 | 32 | 41 |
| Ctrl (ELECTROPLATE) | 2.6 | 9.0 | 34 | 43 |
| MMC | 0.7 | 6.0 | 14 | 8 |

FIG. 18

METAL MATRIX COMPOSITES FOR CONTACTS ON SOLAR CELLS

CROSS-REFERENCE TO RELATED APPLICATIONS

This application is a U.S. National Phase application of PCT/US2016/038197 filed 17 Jun. 2016, which claims priority to U.S. Provisional Application Ser. No. 62/180,960, filed Jun. 17, 2015, the entirety of which is incorporated herein by reference.

GOVERNMENT RIGHTS

This disclosure was made with Government support under Contract No. FA9453-14-1-0242 awarded by the Air Force Research Laboratory. The Government has certain rights in the invention.

TECHNICAL FIELD

Embodiments described herein relate generally to photonics, particularly to generation, emission, control, and detection or sensing of light via integrated photonic source.

BACKGROUND

The advanced solar cells used in space vehicles today are rapidly moving towards thin-film-based inverted metamorphic multijunction (IMM) solar cells mounted on flexible substrates. However, the IMM cells are more prone to cracking than state-of-the-art triple junction cells. The cell cracking can lead to metal contact failure on IMM cells, compromising the power generation. This reliability issue is also becoming increasingly more important for terrestrial thin-film-based, single-crystalline silicon (Si) solar cells. To illustrate, microcracks in crystalline-silicon-based photovoltaic cells have been characterized using electroluminescence after artificial aging and snow damage (see FIG. 1). These microcracks can electrically disconnect areas of the cells and lead to substantial power loss (~16%).

Thus, what is needed is an improved technique to mitigate the power loss and increase the lifetime of IMM cells.

SUMMARY

According to examples of the present disclosure, a method for forming electrical contacts for a solar cell is provided. The method comprises forming a first metal layer over predefined portions of a surface of the solar cell; depositing a carbon nanotube layer over the first metal layer; and forming a second metal layer over the carbon nanotube layer, wherein the first metal layer, the carbon nanotube layer, and the second metal layer form a first metal matrix composite layer that provides electrical conductivity and mechanical support for the solar cell.

According to examples of the present disclosure, a solar cell is provided. The solar cell comprises a substrate and a metal matrix composite layer formed on a top surface of the substrate and configured to provide electrical conductivity and mechanical reinforcement for the metal contacts, wherein the metal matrix composite layer comprises a first metal layer formed on the top surface of the substrate, a carbon nanotube layer formed over the first metal layer, and a second metal layer formed over the carbon nanotube layer.

According to various examples, the first metal layer and the second metal layer comprise a metal selected from the group consisting of: silver, copper, and gold. The carbon nanotube layer is deposited by electrodeposition, nanospreading, drop casting, or spray coating. The carbon nanotube layer is chemically functionalized with a carboxylic acid or an amine group prior to deposition to increase adhesion strength to surrounding metal matrix and achieve efficient metal-nanotube stress transfer. The solar cell can be a standard multijunction solar cell, an inverted metamorphic multijunction solar cell, or a silicon-based terrestrial solar cell. The method further comprising forming a second metal matrix composite layer over the first metal matrix composite layer. The solar cell comprises a III-V compound semiconductor substrate or a silicon substrate. The forming the first metal layer is performed with a cathodic current density of about $\pm 2$-mA/cm$^2$ to about $\pm 10$-mA/cm$^2$ and with silver ion concentration, pH, and bath temperature held constant. The silver ion concentration can be about 1.5 to about 2.3 oz/gal, the operating pH can be about 9.1, and the temperature can be about 25° C. The carbon nanotube layer comprises a plurality of multiwalled carbon nanotubes, single-walled nanotubes, or a mixture of both multiwalled and single-walled nanotubes. The method further comprising forming a silver seeding layer by physical vapor deposition and subsequent electroplating of silver to produce a mirror-like finish. The carbon nanotube layer is chemically functionalized with the carboxylic acid using an acid treatment in a 1:3 HNO$_3$:H$_2$SO$_4$ mixture to produce a negative surface charge. The amine group comprises NH$_2$ to produce a positive surface charge by sonicating the carbon nanotube layer in a 2.8 M NH$_4$Cl aqueous solution. The first metal layer that is formed is about 3-μm in thickness on the solar cell substrate and wherein the carbon nanotube layer that is chemically functionalized is deposited at about −0.5 mA/cm$^2$ for about 15 minutes. The first metal layer and the second metal layer comprise silver and the nanospreading comprises wherein the forming the first metal layer comprises electroplating a 3 μm thick silver layer on a 100 nm thick physical vapor deposition silver seeding layer on a solar cell substrate; wherein depositing the carbon nanotube layer comprises depositing the carbon nanotube layer that is chemically functionalized over the first metal layer by dragging a meniscus of a microliter suspension droplets of carbon nanotubes trapped between the GaAs substrate and moving blade at a constant velocity. The method further comprises repeating the deposition of the carbon nanotube layer that is chemically functionalized about five times at a blade pull speed of about 1 to about 100 μm/s. The method further comprising forming another 3-μm thick layer of silver over carbon nanotube layers to produce a total metal-carbon-metal structure of 6-μm thickness. The carbon nanotube layer forms a network and the second metal layer is at least partially in the network. In the method where depositing a carbon nanotube layer, the method comprises forming a network of carbon nanotubes. In the method where forming a second metal layer over the carbon nanotube layer, the method comprises at least partially embedding the second metal layer within the network.

Additional advantages of the embodiments will be set forth in part in the description which follows, and in part will be understood from the description, or may be learned by practice of the embodiments. The advantages will be realized and attained by means of the elements and combinations particularly pointed out in the appended claims.

It is to be understood that both the foregoing general description and the following detailed description are exemplary and explanatory only and are not restrictive of the embodiments, as claimed.

BRIEF DESCRIPTION OF THE DRAWINGS

The accompanying drawings, which are incorporated in and constitute a part of this specification, illustrate embodiments of the present teachings and together with the description, serve to explain the principles of the disclosure.

FIGS. 3A-3G shows a method of forming a metal matrix composite structure on a solar cell substrate, according to examples of the present disclosure.

FIG. 5A is a plot of cathode potential ($V_c$) vs. cathode current density ($J_c$), where the region between Point D and Point L defines the ideal operating window where the finish of plated Ag is bright, according to examples of the present disclosure.

FIG. 5B is an image of a PVD Ag seeding layer and subsequent electroplating of Ag that results in a mirror finish, according to examples of the present disclosure.

FIG. 18 is a table of performance values for control samples and samples according to examples of the present disclosure (percentage deviation from the control samples).

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g., −1, −2, −3, −10, −20, −30, etc.

The following embodiments are described for illustrative purposes only with reference to the figures. Those of skill in the art will appreciate that the following description is exemplary in nature, and that various modifications to the parameters set forth herein could be made without departing from the scope of the present embodiments. It is intended that the specification and examples be considered as examples only. The various embodiments are not necessarily mutually exclusive, as some embodiments can be combined with one or more other embodiments to form new embodiments. It will be understood that the structures depicted in the figures may include additional features not depicted for simplicity, while depicted structures may be removed or modified.

Generally speaking, examples of the present disclosure provide for a solar cell having metal-carbon-nanotube metal matrix composites for metal contacts for metal gridlines and methods of making thereof. The metal films imbedded with multiwalled carbon nanotubes (CNTs) are known as metal matrix composites (MMCs), and can provide for reinforced mechanical strength against stress-induced cracks in the solar cells and gapping capability to electrically bridge microcracks that form due to thermal and mechanical stress. The metal can include, but is not limited to, silver, gold, and copper. Other metals that have good electrical conductivity can also be used. The high mechanical strength and good electrical/thermal conductivities of CNTs make them a suitable component in the MMC to reinforce the metal gridlines. However, in order to harness these properties, CNTs have to be properly imbedded within the metal matrix.

Figure 1:
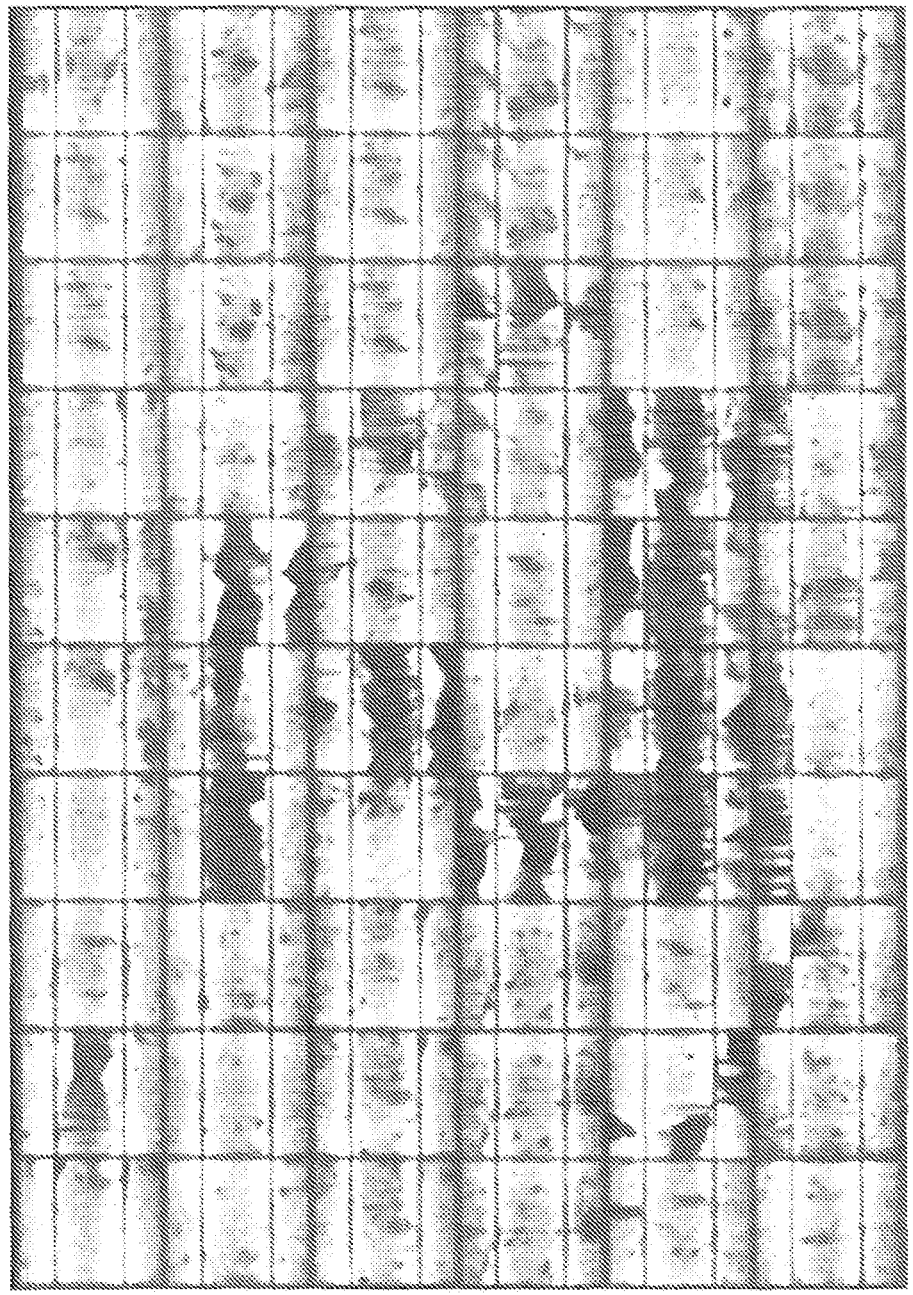
FIG. 1 shows an electroluminescence image of a microcracked conventional PV module, where the dark regions are electrically inactive areas.
Figure 2:
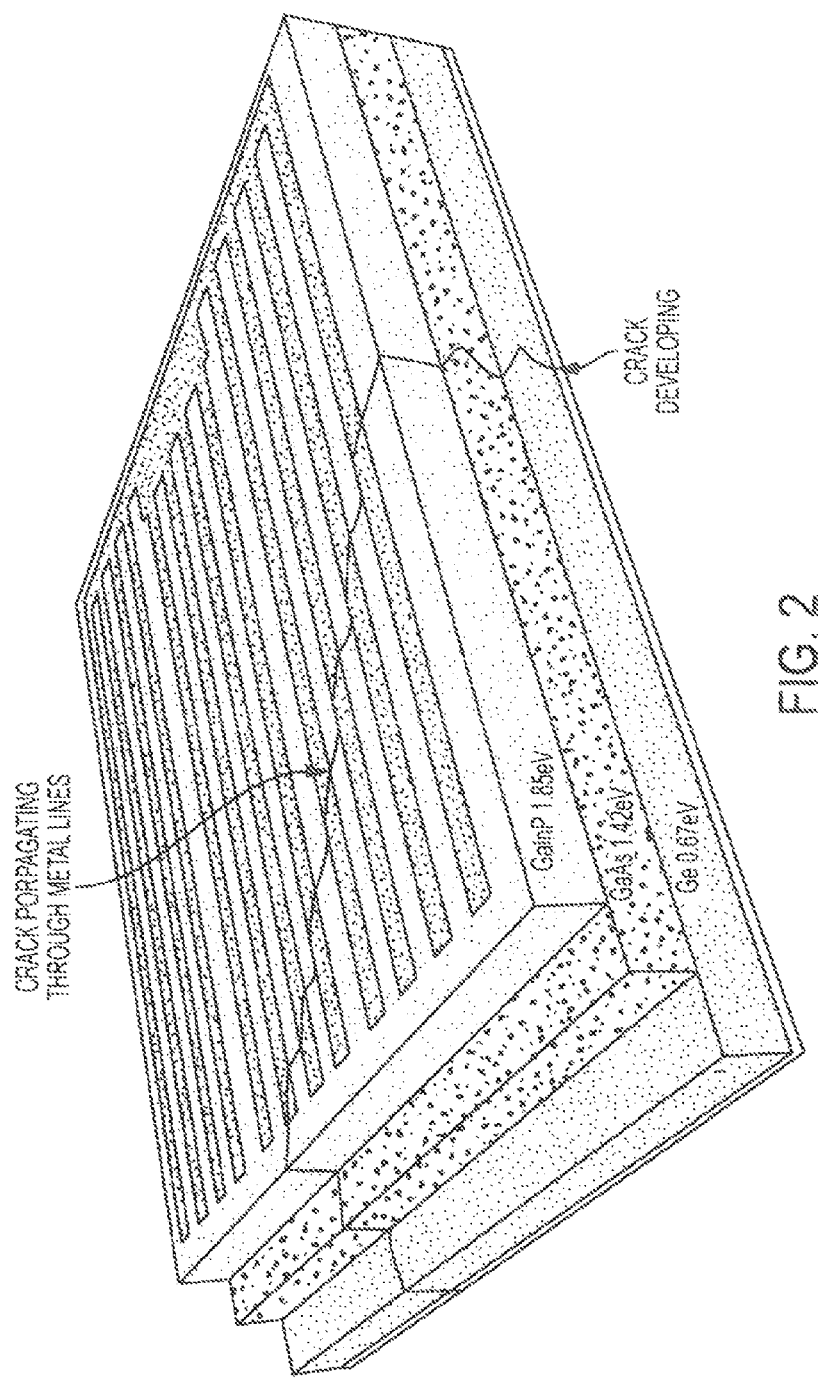
FIG. 2 shows a representation of a solar cell with a crack through the layers of the cell and across the metal gridlines.

FIG. 1 shows an electroluminescence image of a microcracked photovoltaic ("PV") module, where the dark regions are electrically inactive area. FIG. 2 shows a representation of a multi junction solar cell with a crack running through the layers of the solar cell, as well as across the metal gridlines.

FIGS. 3A-3G show a method of forming a MMC microstructure, according to examples of the present disclosure. In this example, the MMC microstructure is an Ag-CNT-Ag layer-by-layer (LBL) structure, in which functionalized CNTs are deposited on electroplated Ag in an alternating fashion. The substrate on which the MMC microstructure is formed can be a III-V compound semiconductor substrate or a silicon substrate, including, but are not limited to, Si, Ge, GaAs, or InGaP. The CNT layer can comprise a plurality of multiwalled carbon nanotubes, single-walled nanotubes, or a mixture of both multiwalled and single-walled nanotubes. While the below examples show silver as the metal for the metal layers, the metal can be copper, gold, etc., as discussed above. As shown in FIG. 3A, a substrate 305 of a solar cell is subjected to an electrochemical Ag deposition process, using a plating solution 302, such as a commercially available plating solution, E-brite 50/50 RTP, using controlled plating conditions, through the manipulation of parameters including pH, temperature, ionic strength, and current density. The silver ion concentration can be about 1.5 to about 2.3 oz/gal, the operating pH can be about 9.1, and the temperature can be about 25° C. Other methods of depositing the metal can be used, including, but not limited to, sputter deposition or screen printing. The inventors performed experiments to optimize the plating conditions and found that the main variable is cathodic current density ($J_c$), while Ag ion concentration, pH, and bath temperature are held constant. FIG. 5A shows the cathode potential ($V_c$) vs. current density ($J_c$) with corresponding images of Ag electroplated on GaAs substrates. The region between D and L define the ideal operating window where the plated Ag appears bright, which is desirable. A current density of about 2 mA/cm$^2$ to about 10 mA/cm$^2$±0.5 mA/cm$^2$, and more particularly, of about 3 mA/cm$^2$±0.5 mA/cm$^2$ results in a bright finish. FIG. 3B shows the silver layer 310 formed on a top surface of substrate 305 resulting in a silver plated substrate after the electroplating process. The silver layer can have a thickness of about 3 μm±0.5 μm.

Figure 4B:
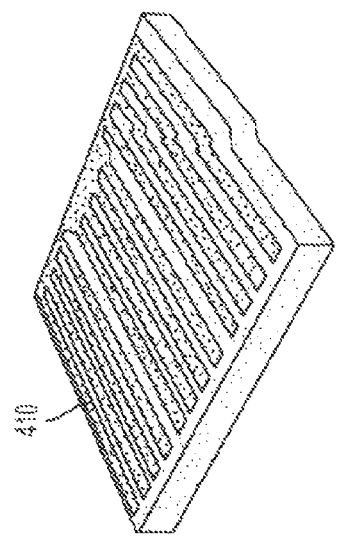
FIGS. 4A and 4B shows a solar cell substrate with a Ag seed layer formed thereon and Ag-CNT-Ag MMC gridlines formed thereon, respectively, according to examples of the present disclosure.
Figure 4A:
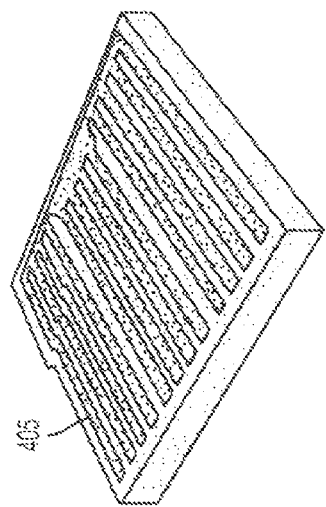

In some examples, an initial seeding layer can be formed on a top surface of the substrate, which can beneficially affect the final film quality. FIG. 4A shows a solar cell substrate with an Ag seed layer 405, according to examples of the present disclosure. Various thin (~100 nm) seeding layers can be used, including, but not limed to, sputter-coated Ti, sputter-coated Ag, and Ag deposited by physical vapor deposition (PVD). The PVD Ag seeding layer and subsequent electroplating of Ag result in a mirror finish, as shown in FIG. 5B.

Figure 6:
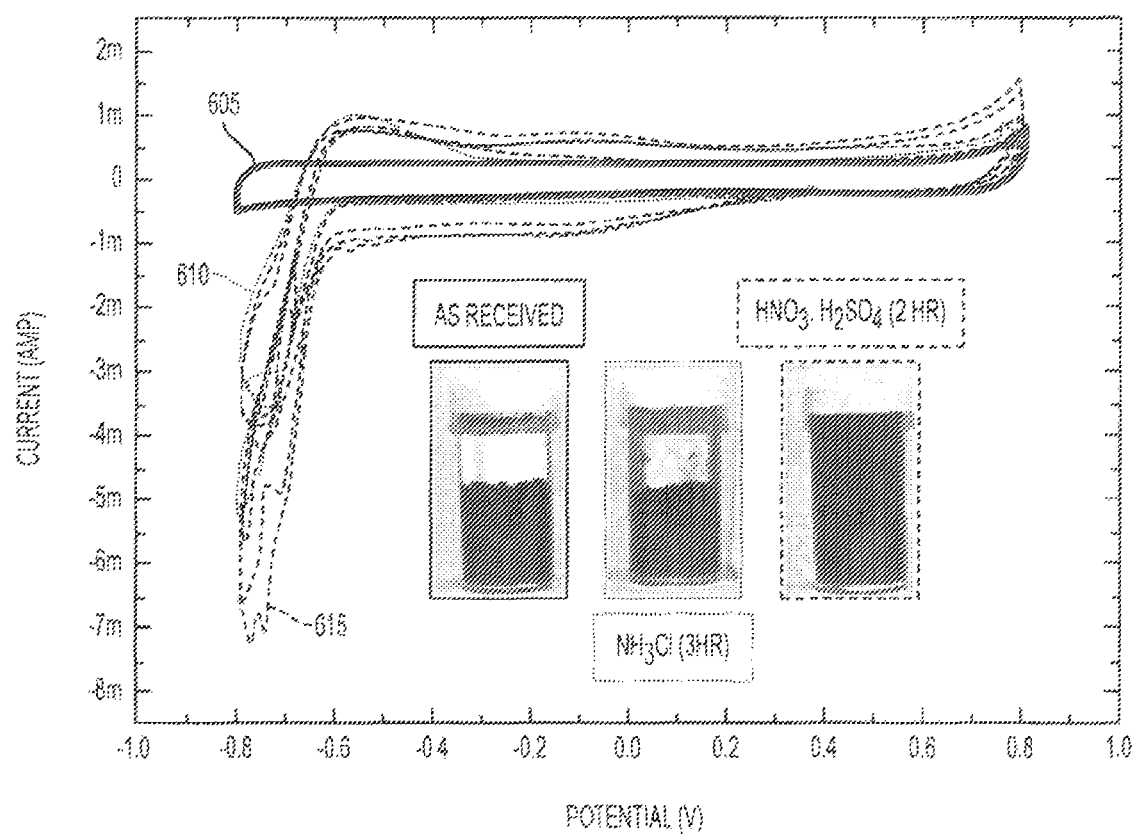
FIG. 6 is a plot of cyclic voltammetry measurements on the as received, amine-terminated, and carboxylated CNTs with corresponding images of the CNTs solutions, according to examples of the present disclosure.

In some examples, CNTs can be incorporated into the metal matrix through chemical functionalization, which allows for chemical bonding between CNTs and their surrounding environment. The chemical functionalization enhances the wettability and adhesion of CNTs to metal. For example, the functionalized CNTs can be suspended in water without any additives, and the aqueous solution can be spray-coated directly onto the substrates. In one example, CNTs are functionalized with a carboxylic acid, i.e., COOH, for negative surface charge, following a standard acid reflux method. The maximum electrokinetic mobility of CNTs is achieved through an acid treatment in a 1:3 $HNO_3$:$H_2SO_4$ mixture. In another example, CNTs are functionalized with an amine group, i.e., $NH_2$, for positive surface charge by sonicating CNTs in 2.8 M $NH_4Cl$ aqueous solution. Carboxylation of CNTs produces stable, homogenous aqueous solutions of CNT. FIG. 6 is the cyclic voltammetry measurements on the as-received substrates without metal gridlines formed thereon 605, $NH_2$-functionalized 610, and COOH-functionalized CNTs 615 with corresponding images of the CNTs solutions. It was observed that the highest overall integrated charge associated with the carboxylated CNTs 615, which indicates that carboxylated CNTs assume the highest amount of surface charge and presumably the highest electrokinetic mobility compared to neutral and amine-terminated CNTs.

FIG. 3C shows the deposition of carbon nanotubes producing a carbon nanotube layer 315 over the silver layer 310 of substrate 305. The carbon nanotube layer 315 can be deposited using the various methods described below, including spray coating. FIG. 3D shows carbon nanotube layer 315, silver layer 310, substrate 305 after nanotube deposition. FIG. 3E shows a top view of FIG. 3D. FIG. 3F shows the formation of a second silver layer using the process of the first silver layer. FIG. 3G shows the completed solar cell with first silver layer 310, carbon nanotube layer 315, and second silver layer 320 forming metal matrix composite 325. The carbon nanotubes form a network and the second metal layer, i.e., silver layer 320, is at least partially embedded in the network. The process can be repeated a number of times forming more than one metal matrix composite layer. FIG. 4B shows the solar cell of FIG. 4A with Ag-CNT-Ag MMC gridlines 410 formed over the Ag seed layer 405, according to examples of the present disclosure.

Figure 7A:
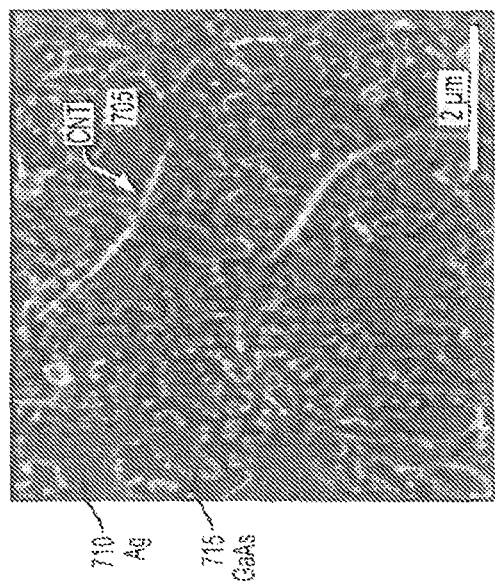
FIG. 7A is a SEM image of COOH-terminated CNTs deposited on 40-nm-thick, sputter-coated Ag to clearly show Ag dissolution during negatively charged CNT deposition on positively biased working electrode, according to examples of the present disclosure.
Figure 7B:
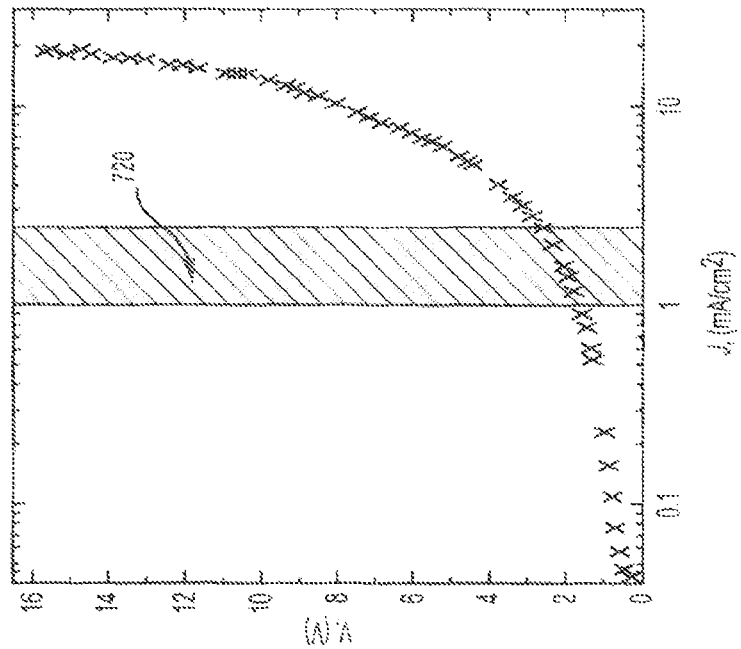
FIG. 7B is a I-V characteristic curve, where the shaded region indicates the optimum operating range above which $V_c$ rapidly rises with increasing $J_c$, according to examples of the present disclosure.

For the microstructural comparison, COOH-terminated CNTs were used to create a LBL Ag composite microstructure. First, about 1-μm to about 4-μm, and more particularly about 2-μm±0.5-μm thick Ag film is electroplated on GaAs followed by electrochemical deposition of CNT-COOH at about −0.1 mA/cm$^2$ to about −10 mA/cm$^2$, and more particularly about −0.5 mA/cm$^2$ for about 15 min, where the negative sign for the current density is to indicate that the working electrode is being biased with a positive potential to draw in negatively charged carboxylated carbon nanotubes. That is, during metal deposition, positively charged metal ions are drawn towards the negatively biased working electrode, whereas during CNT-COOH (carboxylated carbon nanotubes) deposition, negatively charged CNTs are drawn towards a positively biased electrode. The sample is then electroplated with another 2-μm-thick Ag layer. Due to the negative surface charge on CNT-COOH, a positive bias must be applied to the working electrode (i.e., anode) to deposit CNTs. Consequently, the plated Ag dissolves back into the solution during CNT deposition. FIG. 7A is a SEM image of COOH-terminated CNTs 705 deposited on about 10-nm to about 100-nm, and more particularly about 40-nm±10-nm-thick, sputter-coated Ag 710 over a GaAs substrate 715 to show Ag dissolution during negatively charged CNT deposition on positively biased working electrode. FIG. 7B is a I-V characteristic curve, where the shaded region 720 indicates the optimum operating range above which $V_c$ rapidly rises with increasing $J_c$.

Figure 8A:
FIGS. 8A and 8B are SEM images of COOH-terminated CNTs deposited on electroplated Ag, using the nanospreader technique, according to examples of the present disclosure.
Figure 8B:
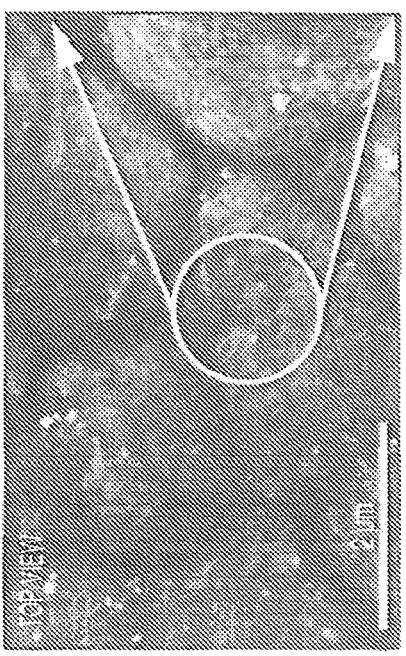
Figure 8C:
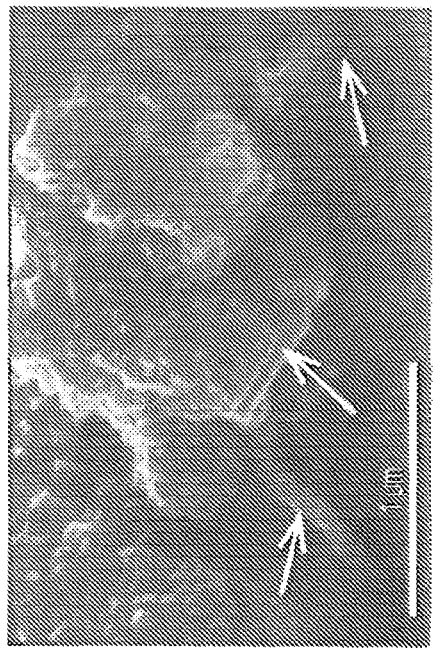
FIGS. 8C and 8D are cross-sectional SEM images of Ag-CNT-Ag composite structure, where the CNTs, indicated by arrows, exhibit good adhesion to the surrounding Ag matrix, according to examples of the present disclosure.
Figure 8D:
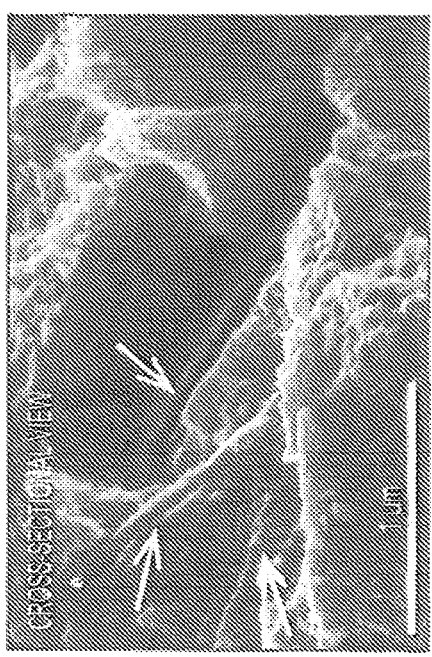

As an alternate method to electrochemical deposition, functionalized CNTs can be deposited using a nanospreader technique. A 2-μm-thick Ag layer is first electroplated on a 100-nm-thick PVD Ag seeding layer on GaAs samples. The nanospreader technique is then used to deposit a thin layer of CNTs by dragging at a constant velocity the meniscus of microliter suspension droplets of CNTs trapped between the substrate and a moving Teflon blade. One to about 100 layers, and more particularly five layers of carboxylated CNTs are successively deposited at a blade pull speed of 1 to about 100-μm/s, and more particularly about 10-μm/s±3-μm/s. The samples are then plated with another 2-μm-thick Ag layer, creating a MMC film with a total thickness of ~4 μm. FIGS. 8A and 8B are SEM images of COOH-terminated CNTs deposited on electroplated Ag, using the nanospreader technique. FIGS. 8C and 8D are cross-sectional SEM images of Ag-CNT-Ag composite structure. The CNTs indicated by arrows exhibit good adhesion to the surrounding Ag matrix. FIGS. 8A-8D show the nanospreader sample before the $2^{nd}$ Ag layer is deposited (FIGS. 8A and 8B) and a cross sectional view after the $2^{nd}$ Ag layer is deposited (FIGS. 8C and 8D). The cross-sectional SEM images show CNTs intercalating the Ag matrix. These images suggest that surface functionalized CNTs adhere well to Ag and that these CNTs would bridge the microcracks that form upon strain-induced failure.

Figure 9:
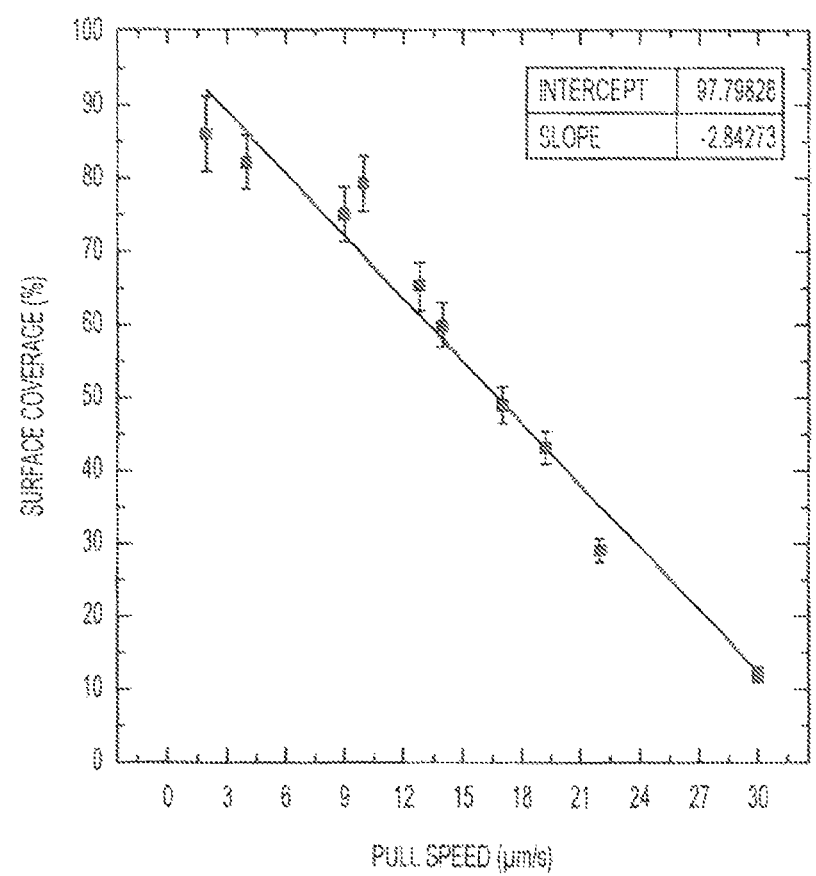
FIG. 9 is a plot of the linear relation between the pull speed and corresponding surface coverage of CNTs using the nanospreader method, according to examples of the present disclosure.
Figure 10A:
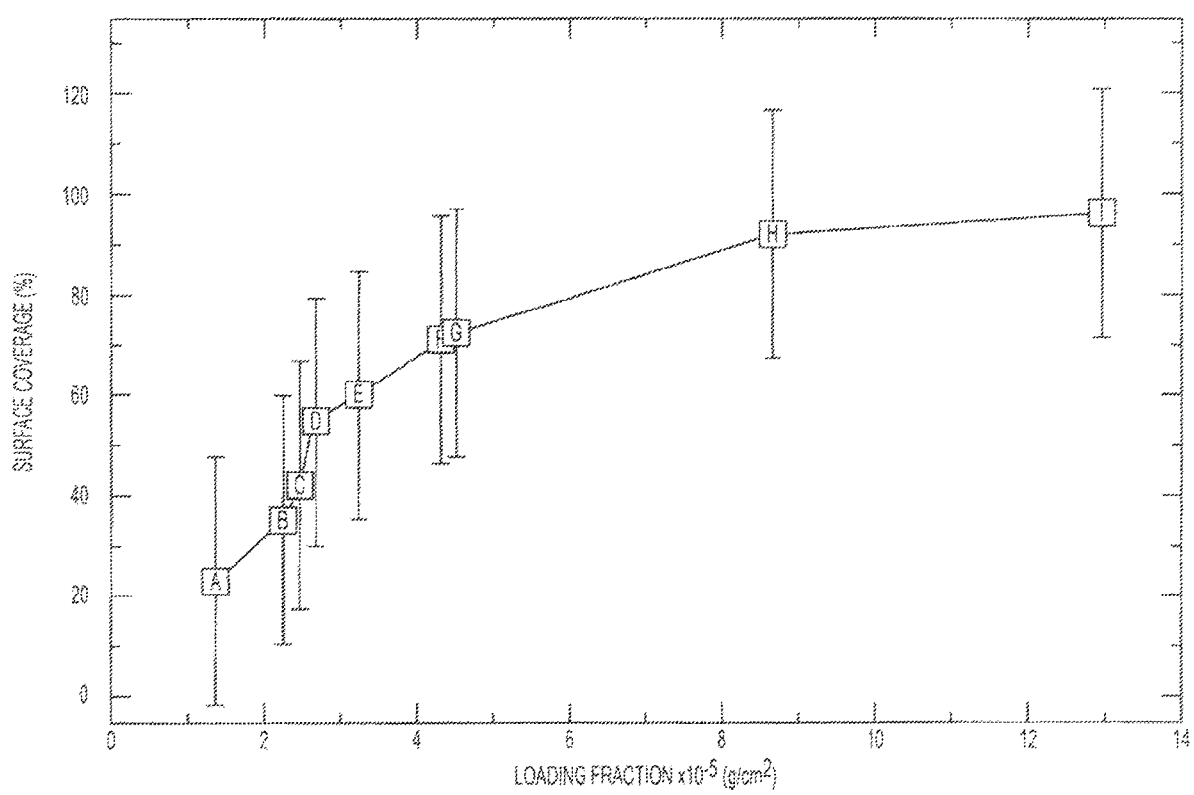
FIG. 10A is a plot of CNTs loading fraction vs. surface coverage with standard deviation bars, according to examples of the present disclosure.
Figure 10B:
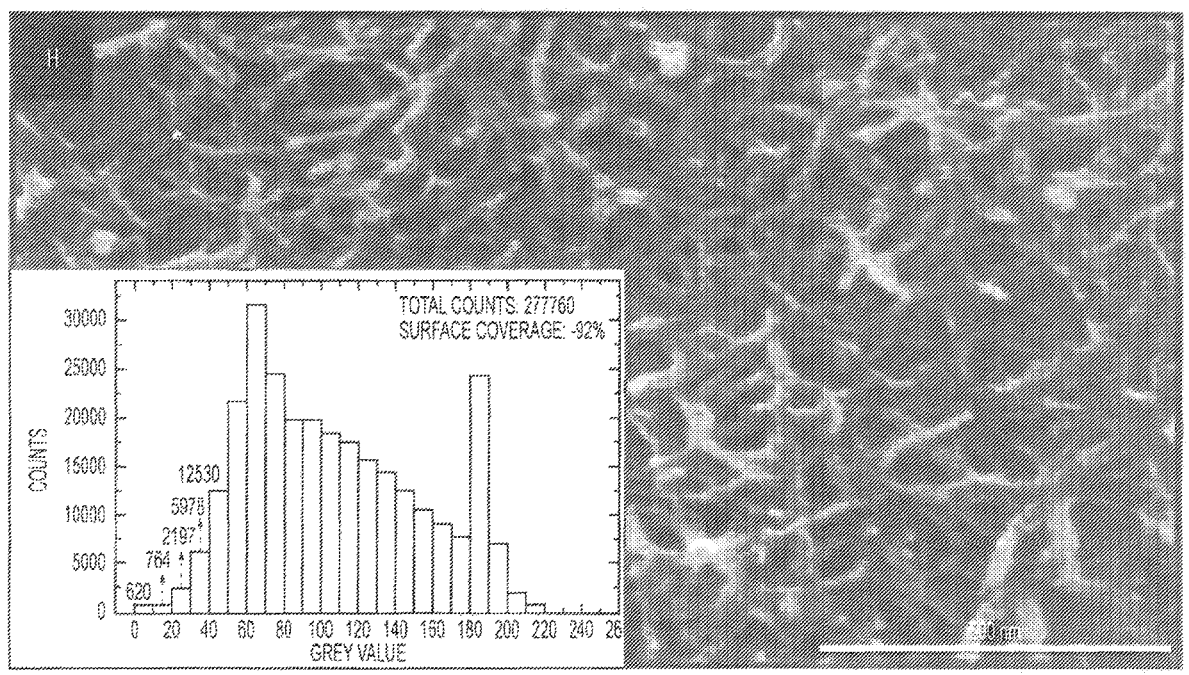
FIG. 10B is histogram of gray values used to computer the plot of FIG. 10A.

The inventors investigated a range of deposition rates using the nanospreader technique with pull speeds ranging from 2 to 30 μm/s and droplet volumes ranging from 10 to 50 μl. Through the manipulation of pull speed, CNT surface coverage ranging from 12% to 86% was obtained. FIG. 9 shows a plot of the linear relation between the pull speed and corresponding surface coverage of CNTs using the nanospreader method from the experiments conducted. The surface coverage is defined as the percentage of substrate surface covered by CNTs, ignoring any CNT overlap. The corresponding surface coverage is quantified though digital image processing of SEM images. Using ImageJ program, the SEM images are converted into a matrix of gray scale values with the corresponding xy-coordinates. The gray scale values are then plotted in a histogram, as shown in FIG. 10B and a cutoff gray value is assigned per image. This cutoff value represents the gray scale value of an open space; hence all gray values less than this cutoff value are counted and divided by the total counts, giving the percentage surface coverage. It is noted that this cutoff value is not a constant due to the variability in contrast and brightness settings from image to image.

While the nanospreader technique offers precise control over the CNT surface coverage, the slow throughput may limit its manufacturability. As an alternative method of deposition, a drop casting method using a solution of carboxylated CNTs was investigated using a range of different CNT loading fractions, i.e., CNT solution concentration, and digitally analyze the subsequent surface coverage, as shown in FIG. 10B. Digital analysis was performed using ImageJ program. FIG. 10A shows how the CNT loading fraction translates to the percentage surface coverage, and in particular shows CNTs loading fraction versus surface coverage with standard deviation bars. As shown in FIG. 10A, past point H (>9 g/cm²), the surface coverage plateaus, asymptotically approaching 100%. A different CNT loading fraction was used to prepare MMC gridlines (each 1-mm-wide) to create the LBL microstructure. First, a 2-μm-thick Ag film is electroplated on a 100-nm-thick PVD Ag seeding layer on an InP substrate. The solution of CNT-COOH is then drop-cast at room temperature. Another 2-μm-thick Ag layer is finally electroplated on top.

Figure 11A:
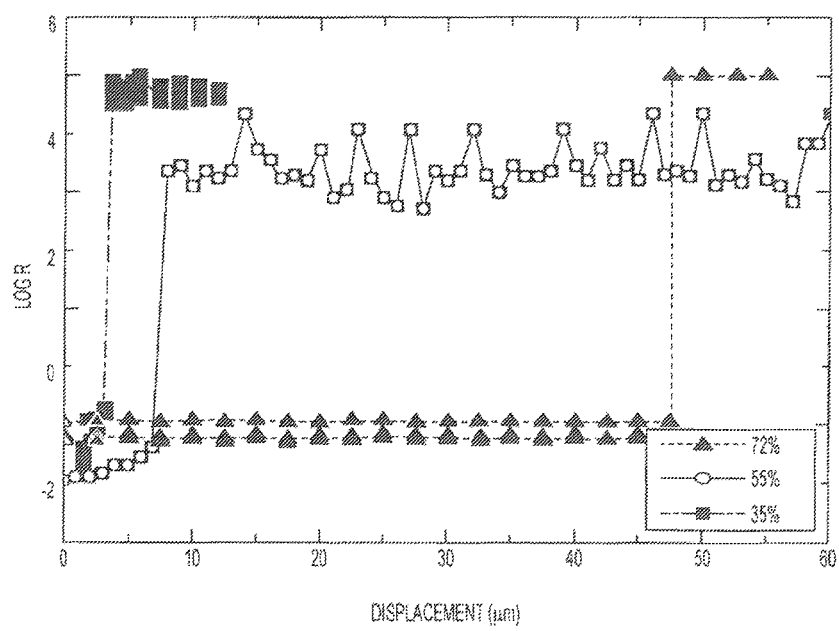
FIG. 11A is a log plot of resistance vs. gap across fractured MMC gridlines with three different CNT surface coverages, according to examples of the present disclosure.
Figure 11B:
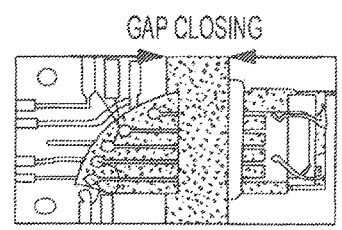
FIG. 11B shows two printed circuit boards used in the test from which FIG. 11A was generated.
Figures 12A, 12B:
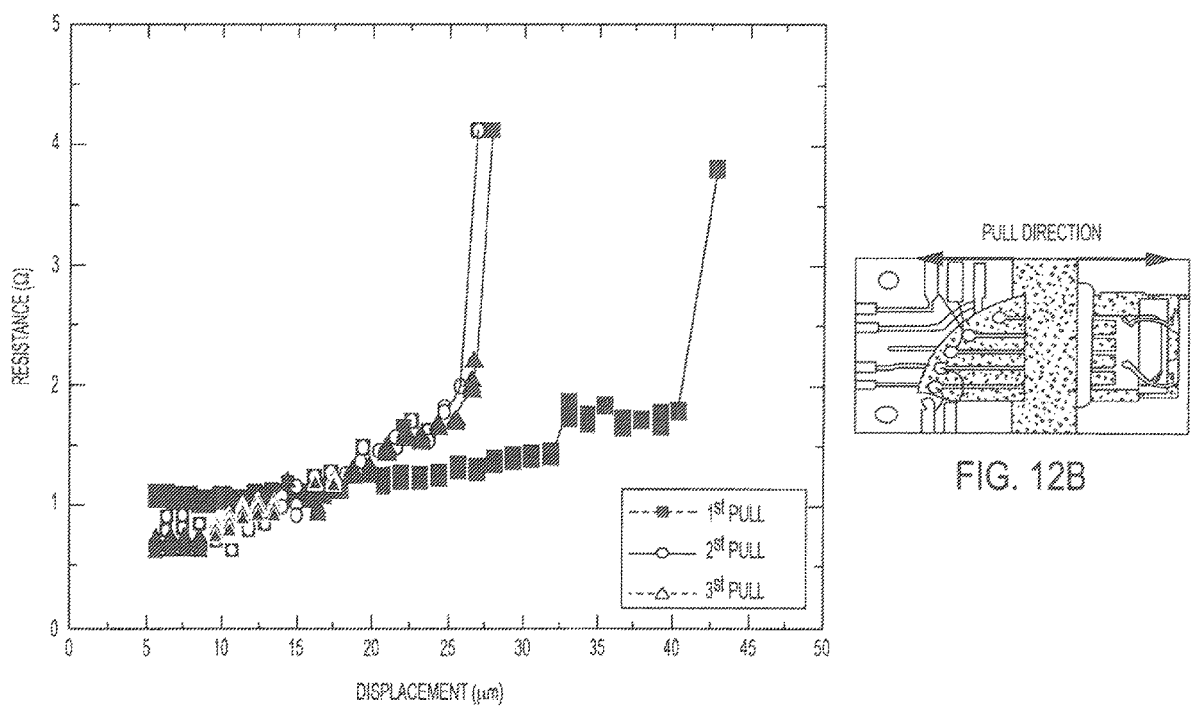
FIG. 12A is a plot of results of a strain failure test of a MMC gridline (96% CNT surface coverage using drop cast method), according to examples of the present disclosure.
FIG. 12B shows two printed circuit boards used in the test from which FIG. 12A was generated.

A strain failure test was performed to determine how well the MMC samples can maintain the electrical conductivity upon mechanical fracture. A set of four parallel MMC gridlines, deposited on an InP substrate, were first mounted on two printed circuit boards using an adhesive (FIGS. 11B and 12B). Upon curing the adhesive, the substrate was scribed with a diamond tip to generate a crack that propagates across the substrate backside, orthogonal in direction to the MMC gridlines. The cracked substrate was then attached to a linear stage controlled by a stepper motor. The resistance across each of the MMC gridlines was continuously recorded as the gridlines are pulled apart at micron increments until the electrical resistivity approaches infinity upon plastic failure. Following the first electrical disconnect, the gap was incrementally closed in reverse until the electrical connection is reestablished across the gridlines; the substrate was then pulled apart again. This process was repeated until no further change is seen in the gap width at which the connection is lost. FIG. 11A shows a log plot of resistance versus gap across fractured MMC gridlines with three different CNT surface coverages. The connection was reestablished at 49 μm, 9 μm, and 5 μm for samples with CNT surface coverage of 72%, 55%, and 35%, respectively. FIG. 12A shows a strain failure test results of a MMC gridline pull test with 96% CNT coverage using the drop cost method. After the second pull test, the maximum gap, at which the electrical connection is lost, is reduced by ~34% but subsequently remained constant with additional pull tests.

Figure 13:
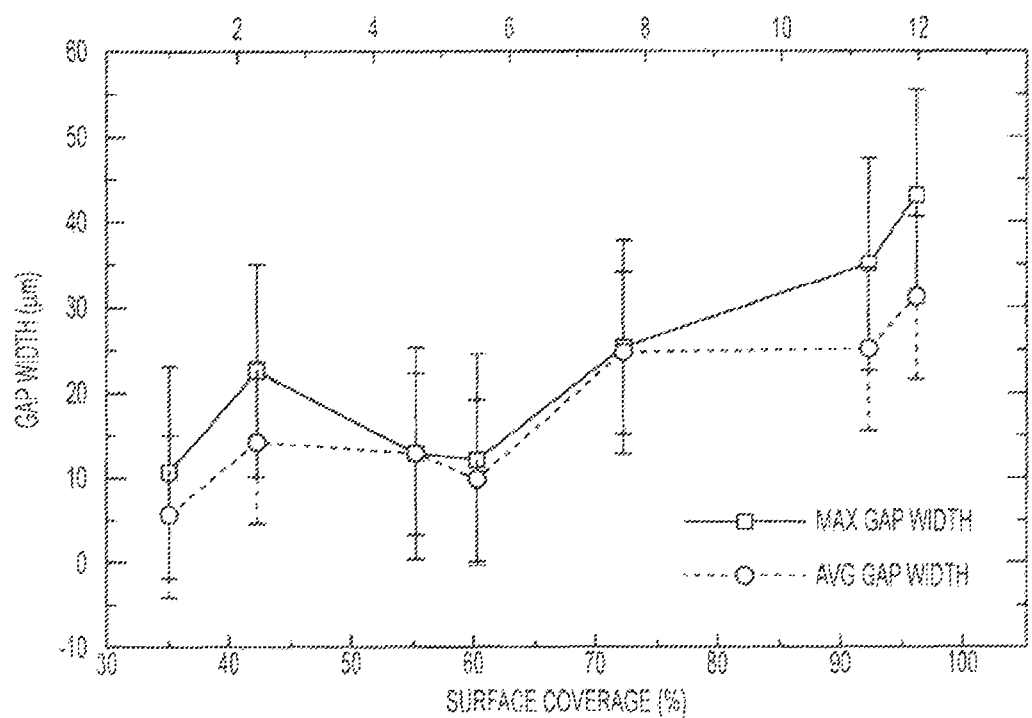
FIG. 13 is a plot of maximum and average gap widths achieved before lost connection as a function of CNT surface coverage and loading fraction, according to examples of the present disclosure.

Using the drop casting method, a set of MMC samples were prepared with different CNT surface coverage. The MMC gridlines were assessed using the strain failure test. Four gridlines with the same CNT loading were tested and the maximum and average gaps before the loss of electrical connection were recorded in FIG. 13, which shows a plot of gap width in μm versus surface coverage percentage. The pull tests reveal that the electrical connection is maintained across larger gaps with higher CNT surface coverage, reaching a maximum of 42-μm-wide gap. As the CNT surface coverage increases from 35% to 96%, a monotonic increase in the average gap was observed. Electroplated Ag lines without CNTs were also analyzed as control, using the strain failure test. Unlike MMC films, the Ag gridlines did not withstand the initial crack generated on the substrate (~4-μm-wide), and the electrical connection is immediately and irrecoverably lost.

Figure 14:
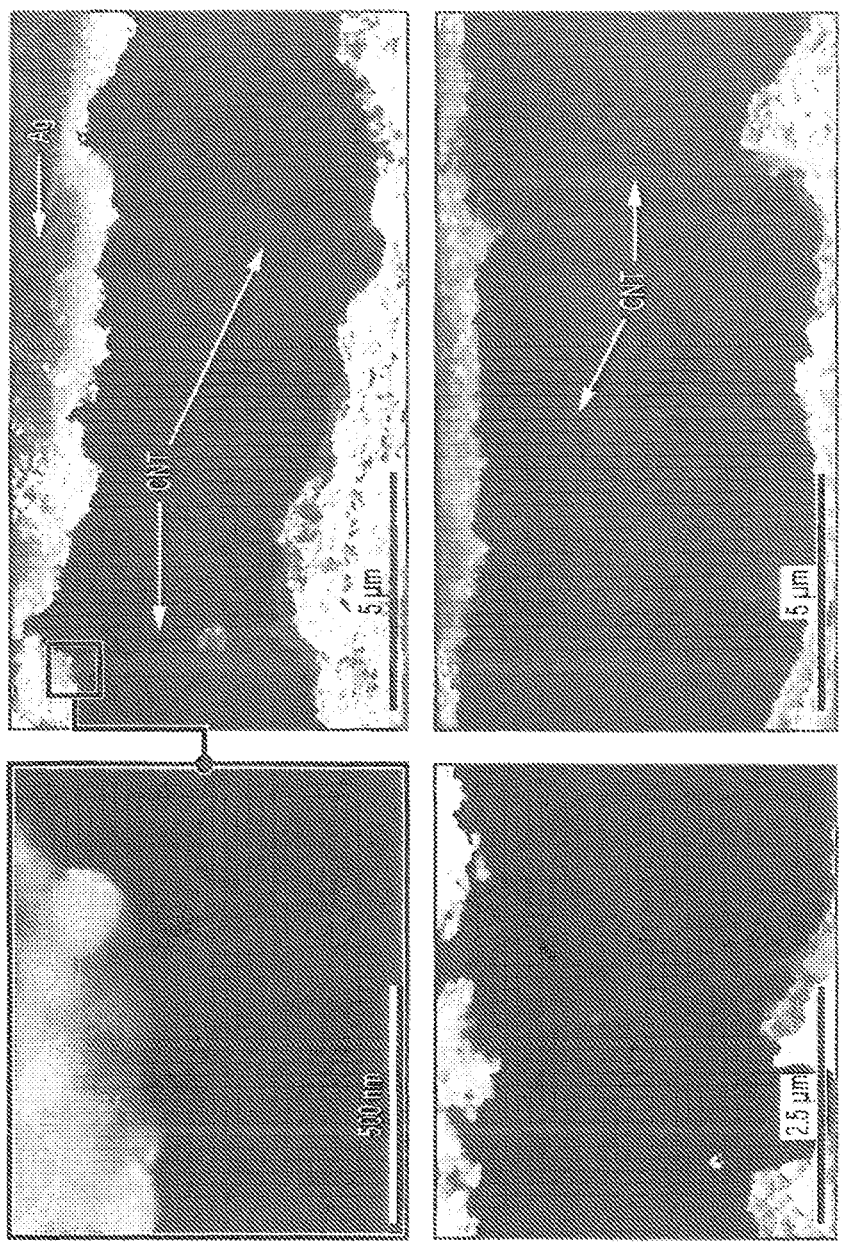
FIG. 14 are SEM images of CNTs anchored in Ag layers showing CNTs bridging cracks up to 9-μm-wide, according to examples of the present disclosure.

It is evident that the incorporation of CNTs within the Ag matrix enhances the electrical conductivity of metal lines upon fracture. To visualize this capability, a MMC film was intentionally fractured and the cracks were examined under SEM. It was observed that CNTs of various lengths bridging gaps ranging from 0.2 to 9 μm. FIG. 14 shows a series of SEM images of the CNTs anchored in Ag layers that show CNTs bridging cracks up to 9 μm wide. The CNTs are anchored in the Ag matrix, indicating a good adhesion between the functionalized CNTs and the Ag matrix.

Mechanical characterization was performed on the MMC films using a Berkovich round tip nanoindenter. Stress-strain curves were obtained a depth profile of 2 μm. 4-μm-thick MMC samples were prepared using nanospreader and drop casting methods to deposit CNTs at various loading fractions. The nanoindentation analysis revealed that the composite film has a lower elastic modulus (10 GPa) than pure silver (73 GPa), which is contrary to initial prediction given the high elastic modulus of CNTs (1000 GPa). The lower elastic modulus is attributed to the electroplating process of silver, in which hydrogen is incorporated and trapped within the composite. Finite element analysis also corroborates this speculation, where the elastic modulus near 10 GPa is predicted with approximately 4% void fraction. While the composite elastic modulus is lower than that of pure silver, the strain failure tests show that carbon nanotubes can bridge 10 to 42-μm-wide microcracks, maintaining the electrical conductivity.

Figure 15A:
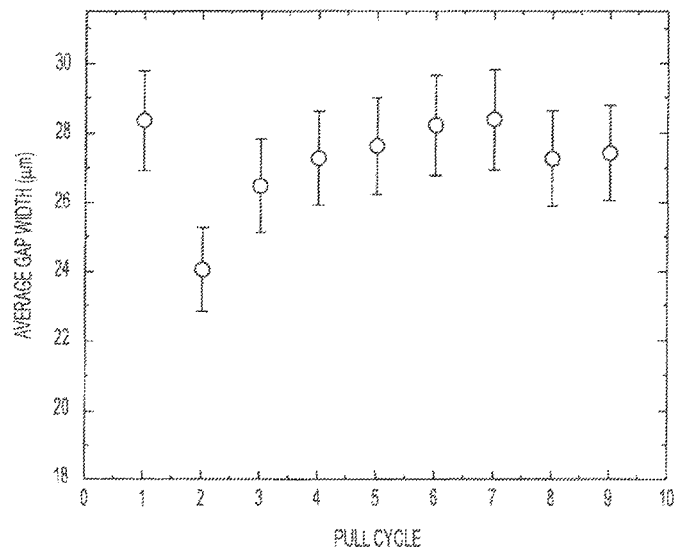
FIG. 15A is a plot of average gap width versus pull cycle, according to examples of the present disclosure.
Figure 15B:
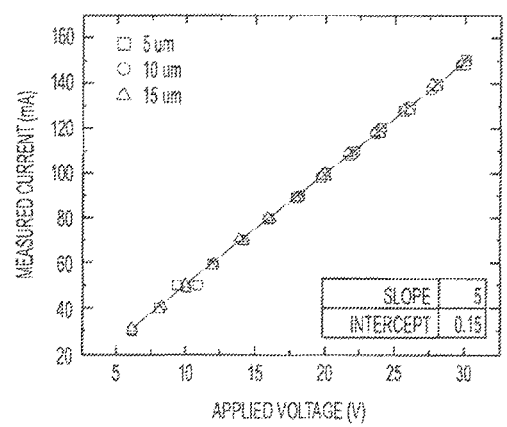
FIG. 15B shows a plot of measured current versus applied voltage, according to examples of the present disclosure.

FIG. 15A shows a plot of average gap width versus pull cycle. FIG. 15B shows a plot of measure current versus applied voltage. The plot of FIG. 15A shows how the carbon nanotubes can bridge the crack in the metal layers, and how this bridging process can be repeated as the broken metal lines are pulled close together and pulled apart in a repeat cycle.

Figure 16:
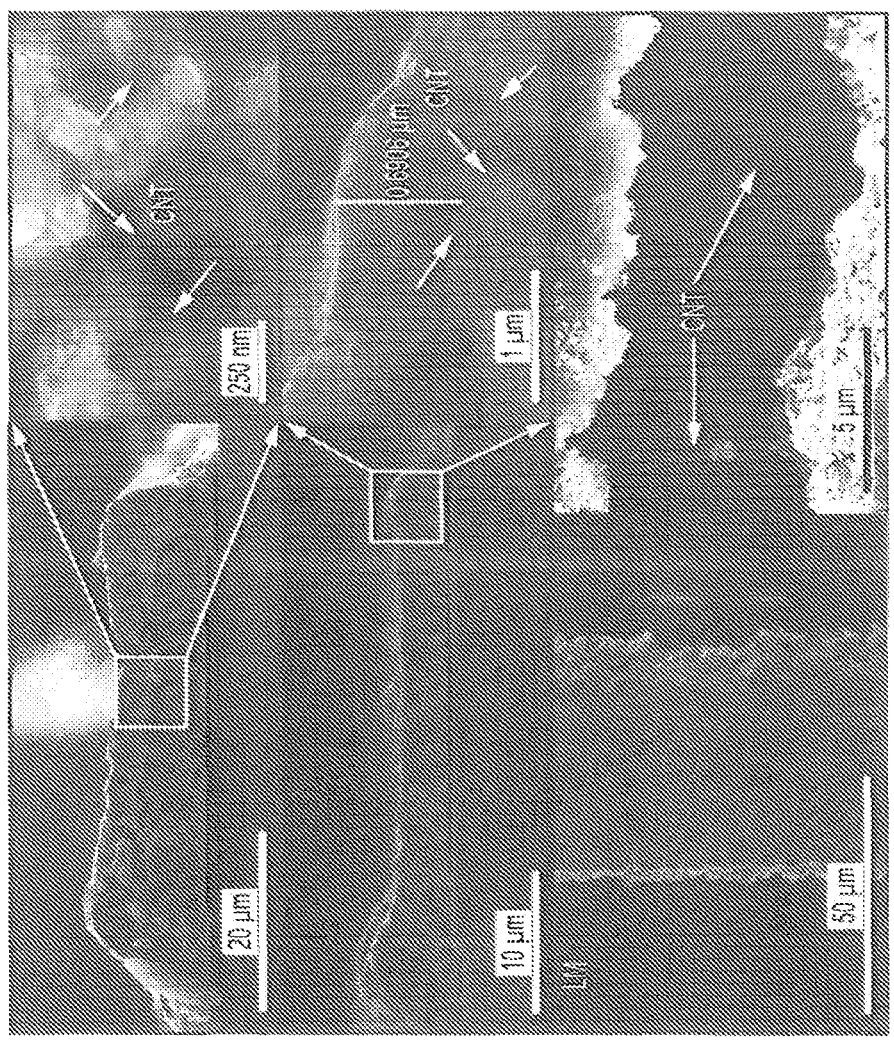
FIG. 16 are another set of SEM images of CNTs anchored in Ag layers showing CNTs bridging cracks up to 9-μm-wide, according to examples of the present disclosure.

FIG. 16 shows another series of SEM images showing the CNTs bridging gaps in the solar cell, and in particular shows a cross-sectional views of a typical metal matrix composite stack integrated onto a commercial triple junction cell.

Figure 17A:
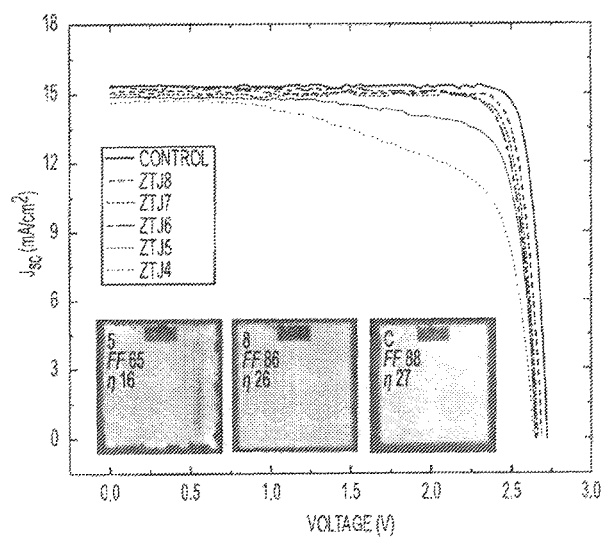
FIGS. 17A and 17B are plots of current density versus voltage characteristics of commercial triple junction solar cells before and after cracks form, respectively, according to examples of the present disclosure.
Figure 17B:
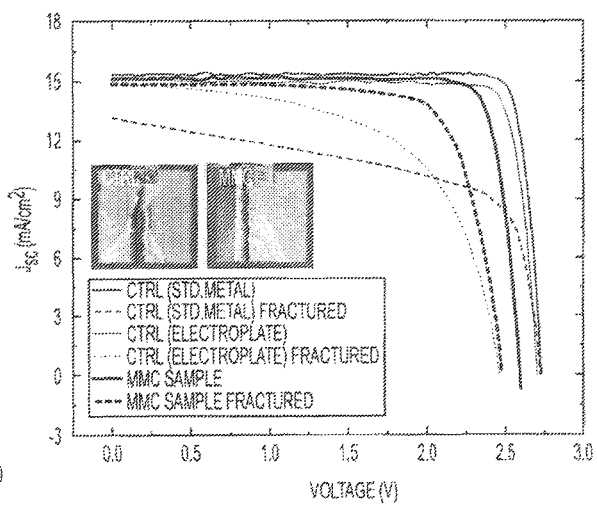

FIGS. 17A and 17B shows plots of current density versus voltage for different test samples under different stress conditions, and in particular, shows how the metal matrix composite lines according to the present examples help maintain the solar cell performance without degradation even after substrate fracture, whereas the standard conventional metal lines used in commercial products lead to immediate degradation in solar cell performance after substrate fracture.

FIG. 18 shows a table that compares the commercial metal line, electrodeposited metal line, and metal matrix composite lines, where the MMC shows the least change (represented here as % delta) after substrate fracture. That is, there is no noticeable degradation in solar cell performance when the composite metal matrix is used in place of commercial or electroplated metal lines.

In summary, metal-CNT-metal matrix composite (MMC) films are provided that maintain electrical conductivity upon mechanical fracture of the substrate. The composite lines are capable of bridging cracks in the underlying semiconductor substrates up to 42 μm. That is, the incorporation of CNTs within the metal matrix renders the metal lines more resilient against mechanical failures, compared to the 100% Ag lines. In addition, to maintaining the electrical conductivity over the stress-induced cracks, the composite films can reestablish the electrical connection when the cracks close up. This "self-healing" behavior of MMC gridlines is a strongly desirable characteristic in consideration of the extreme temperature fluctuations encountered in space operations, in which the PV cells undergo constant expansion and contraction.

While the embodiments have been illustrated respect to one or more implementations, alterations and/or modifications can be made to the illustrated examples without departing from the spirit and scope of the appended claims. In addition, while a particular feature of the embodiments may have been disclosed with respect to only one of several implementations, such feature may be combined with one or more other features of the other implementations as may be desired and advantageous for any given or particular function.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of three A, B and C.

Other embodiments will be apparent to those skilled in the art from consideration of the specification and practice of the descriptions disclosed herein. It is intended that the specification and examples be considered as exemplary only, with a true scope and spirit of the embodiments being indicated by the following claims.

What is claimed is:

1. A method for forming electrical contacts for a solar cell, the method comprising:
   forming a first metal layer over predefined portions of a sun exposed major surface of the solar cell for forming the electrical contacts for gridlines of the solar cell;
   depositing a network of carbon nanotubes over the first metal layer; and
   depositing a second metal layer onto the network of carbon nanotubes, wherein the second metal layer infiltrates the network of carbon nanotubes to connect with the first metal layer to form a first metal matrix composite comprising a metal matrix and a carbon nanotube reinforcement, wherein the second metal layer is an electrically conductive layer in which the carbon nanotube reinforcement is embedded in and bonded to the metal matrix, and the first metal matrix composite provides enhanced mechanical support, and enhanced or equal electrical conductivity for the electrical contacts against applied mechanical stressors to the electrical contacts.

2. The method of claim 1, wherein the first metal layer and the second metal layer comprise a metal selected from the group consisting of: silver, copper, and gold.

3. The method of claim 1, wherein the network of carbon nanotubes is deposited by electrodeposition, nanospreading, drop casting, or spray coating.

4. The method of claim 3, wherein the network of carbon nanotubes is chemically functionalized with a carboxylic acid or an amine group prior to deposition to increase adhesion strength to surrounding metal matrix and achieve efficient metal-nanotube stress transfer.

5. The method of claim 1, wherein the solar cell is an inverted metamorphic multijunction solar cell.

6. The method of claim 1, further comprising forming a second metal matrix composite over the first metal matrix composite.

7. The method of claim 3, wherein the solar cell comprises a III-V compound semiconductor substrate.

8. The method of claim 1, wherein the forming the first metal layer is performed with a cathodic current density of about 2-mA/cm$^2$ to about 10-mA/cm$^2$ and with silver ion concentration, pH, and bath temperature held constant.

9. The method of claim 1, wherein the network of carbon nanotubes comprises a plurality of multiwalled carbon nanotubes, single-walled nanotubes, or a mixture of both multiwalled and single-walled nanotubes.

10. The method of claim 1, further comprising forming a silver seeding layer, prior to forming a first metal layer, by physical vapor deposition and subsequent electroplating of silver to produce a mirror-like finish.

11. The method of claim 4, wherein the network of carbon nanotubes is chemically functionalized with the carboxylic acid using an acid treatment in a 1:3 $HNO_3:H_2SO_4$ mixture to produce a negative surface charge.

12. The method of claim 4, wherein the amine group comprises NH2 to produce a positive surface charge by sonicating the carbon nanotube layer in a 2.8 M $NH_4Cl$ aqueous solution.

13. The method of claim 7, wherein the first metal layer that is formed is about 3-.mu.m in thickness on the solar cell substrate and wherein the network of carbon nanotubes that is chemically functionalized is deposited at about −0.5 $mA/cm^2$ for about 15 minutes.

14. The method of claim 3, wherein the first metal layer and the second metal layer comprise silver and the nanospreading comprises: wherein the forming the first metal layer comprises electroplating a 2 μm thick silver layer on a 100 nm thick physical vapor deposition silver seeding layer on a solar cell substrate; wherein depositing the network of carbon nanotubes comprises depositing the network of carbon nanotubes that is chemically functionalized over the first metal layer by dragging a meniscus of a microliter suspension droplets of carbon nanotubes trapped between the first metal layer and moving blade at a constant velocity.

15. The method of claim 14, further comprising repeating the deposition of the network of carbon nanotubes that is chemically functionalized about five times at a blade pull speed of about 1 to about 100 μm/s.

16. The method of claim 14, further comprising forming another 3-μm thick layer of silver over the network of carbon nanotubes to produce a total metal-carbon-metal structure of 6-μm thickness.

17. The method of claim 1, wherein the network of carbon nanotubes cover an area of a top surface of the first metal layer coverage ranging from 12% to 86% of the top surface.

18. A method for forming electrical contacts for a solar cell, the method comprising:
   forming a first metal layer over predefined portions of a surface of the solar cell;
   forming a network of carbon nanotubes over the first metal layer; and
   infiltrating a second metal into the network of carbon nanotubes to form a metal matrix composite comprising a metal matrix and a carbon nanotube reinforcement, wherein the metal matrix connects with the first metal layer, wherein the metal matrix composite is an electrically conductive layer in which the carbon nanotube reinforcement is embedded in and bonded to the metal matrix, and the metal matrix composite provides enhanced mechanical support, and enhanced or equal electrical conductivity for the electrical contacts against applied mechanical stressors to the electrical contacts.

19. A method for forming electrical contacts for a solar cell, the method comprising:
   forming a first metal layer over predefined portions of a surface of the solar cell;
   depositing a network of carbon nanotubes over the first metal layer; and
   depositing a second metal layer onto the network of carbon nanotubes, wherein the second metal layer infiltrates the network of carbon nanotubes to connect with the first metal layer to form a metal matrix composite comprising a metal matrix and a carbon nanotube reinforcement, wherein the second metal layer is an electrically conductive layer in which the carbon nanotube reinforcement is embedded in and bonded to the metal matrix, and the metal matrix composite provides enhanced mechanical support, and enhanced or equal electrical conductivity for the electrical contacts against applied mechanical stressors to the electrical contacts,
   wherein the network of carbon nanotubes cover an area of a top surface of the first metal layer coverage ranging from 12% to 86% of the top surface.

\* \* \* \* \*